United States Patent
Grivna

(10) Patent No.: US 8,921,184 B2
(45) Date of Patent: Dec. 30, 2014

(54) METHOD OF MAKING AN ELECTRODE CONTACT STRUCTURE AND STRUCTURE THEREFOR

(75) Inventor: Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 396 days.

(21) Appl. No.: 13/471,160

(22) Filed: May 14, 2012

(65) Prior Publication Data

US 2013/0299996 A1 Nov. 14, 2013

(51) Int. Cl.
*H01L 21/336* (2006.01)
*H01L 21/44* (2006.01)
*H01L 21/4763* (2006.01)
*H01L 29/66* (2006.01)
*H01L 29/78* (2006.01)

(52) U.S. Cl.
CPC ...... *H01L 29/66719* (2013.01); *H01L 29/7813* (2013.01)
USPC .......................... 438/270; 438/652; 438/589

(58) Field of Classification Search
CPC .................. H01L 29/66719; H01L 29/7813
USPC .......................................... 438/270, 652, 589
See application file for complete search history.

(56) References Cited

U.S. PATENT DOCUMENTS

| | | | |
|---|---|---|---|
| 6,710,403 B2 | 3/2004 | Sapp | |
| 6,750,508 B2 | 6/2004 | Omura | |
| 7,183,610 B2 | 2/2007 | Pattanayak et al. | |
| 7,211,860 B2 | 5/2007 | Zundel et | |
| 7,282,406 B2 | 10/2007 | Grivna et al. | |
| 7,345,342 B2 | 3/2008 | Challa et al. | |
| 7,408,223 B2 | 8/2008 | Hueting | |
| 7,449,354 B2 | 11/2008 | Marchant et al. | |
| 7,476,589 B2 * | 1/2009 | Grebs et al. | 438/270 |
| 7,557,409 B2 | 7/2009 | Pattanayak et al. | |
| 7,704,836 B2 | 4/2010 | Pattanayak et al. | |
| 7,915,672 B2 | 3/2011 | Venkatraman | |
| 8,021,947 B2 * | 9/2011 | Grivna et al. | 438/270 |
| 8,247,296 B2 * | 8/2012 | Grivna | 438/270 |
| 2006/0214222 A1 | 9/2006 | Challa et al. | |
| 2007/0126055 A1 | 6/2007 | Hueting et al. | |
| 2009/0108343 A1 | 4/2009 | Nemtsev et al. | |
| 2010/0123187 A1 | 5/2010 | Burke et al. | |
| 2010/0123220 A1 | 5/2010 | Burke et al. | |
| 2010/0187602 A1 | 7/2010 | Woolsey et al. | |
| 2011/0136310 A1 | 6/2011 | Grivna | |

* cited by examiner

*Primary Examiner* — Luan C Thai
(74) *Attorney, Agent, or Firm* — Kevin B. Jackson

(57) ABSTRACT

In one embodiment, a method for forming a semiconductor device having a shield electrode includes forming first and second shield electrode contact portions within a contact trench. The first shield electrode contact portion can be formed recessed within the contact trench and includes a flat portion. The second shield electrode contact portion can be formed within the contact trench and makes contact to the first shield electrode contact portion along the flat portion.

20 Claims, 17 Drawing Sheets

US 8,921,184 B2

METHOD OF MAKING AN ELECTRODE CONTACT STRUCTURE AND STRUCTURE THEREFOR

CROSS-REFERENCE TO RELATED APPLICATIONS

This application is related to U.S. patent application No. 13/471,105, an application entitled "METHOD OF MAKING AN INSULATED GATE SEMICONDUCTOR DEVICE HAVING A SHIELD ELECTRODE STRUCTURE" having a common assignee and a common inventor, and filed concurrently on May 14, 2012.

BACKGROUND OF THE INVENTION

This document relates generally to semiconductor devices, and more specifically to methods of forming insulated gate devices and structures.

Metal oxide field effect semiconductor transistor (MOSFET) devices have been used in many power switching applications, such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions, and allows for majority carrier conduction between these regions.

There is a class of MOSFET devices in which the gate electrode is formed in a trench that extends downward from a major surface of a semiconductor material, such as silicon. Current flow in this class of devices is primarily in a vertical direction through the device, and, as a result, device cells can be more densely packed. All else being equal, the more densely packed device cells can increase the current carrying capability and can reduce on-resistance of the device.

Achieving reduced specific on-resistance (ohm-area) performance is one important goal for MOSFET device designers. A reduced specific on-resistance can determine product cost and gross margins or profitability for a MOSFET design. For example, a low specific on-resistance allows for a smaller MOSFET die or chip, which in turn leads to lower costs in semiconductor materials and package structures. However, challenges continue to exist in manufacturing higher density MOSFET devices that achieve the desired performance including reduced specific on-resistance. Such challenges include providing reliable die size or pitch reductions, reducing manufacturing costs, simplifying process steps, and improving yields.

Accordingly, it is desirable to have a method and structure that reduces cell size, reduces manufacturing costs, simplifies processing steps, improve yields, or combinations thereof. Additionally, it is beneficial for the method and structure to maintain or improve electrical performance compared to related structures.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-channel devices, a person of ordinary skill in the art understands that P-channel devices and complementary devices are also possible in accordance with the present description. For clarity of the drawings, doped regions of device structures are illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description can embody either a cellular base design (in which the body regions are a plurality of distinct and separate cellular or stripe regions) or a single base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular base design and a single base design.

DETAILED DESCRIPTION OF THE DRAWINGS

Figure 1:
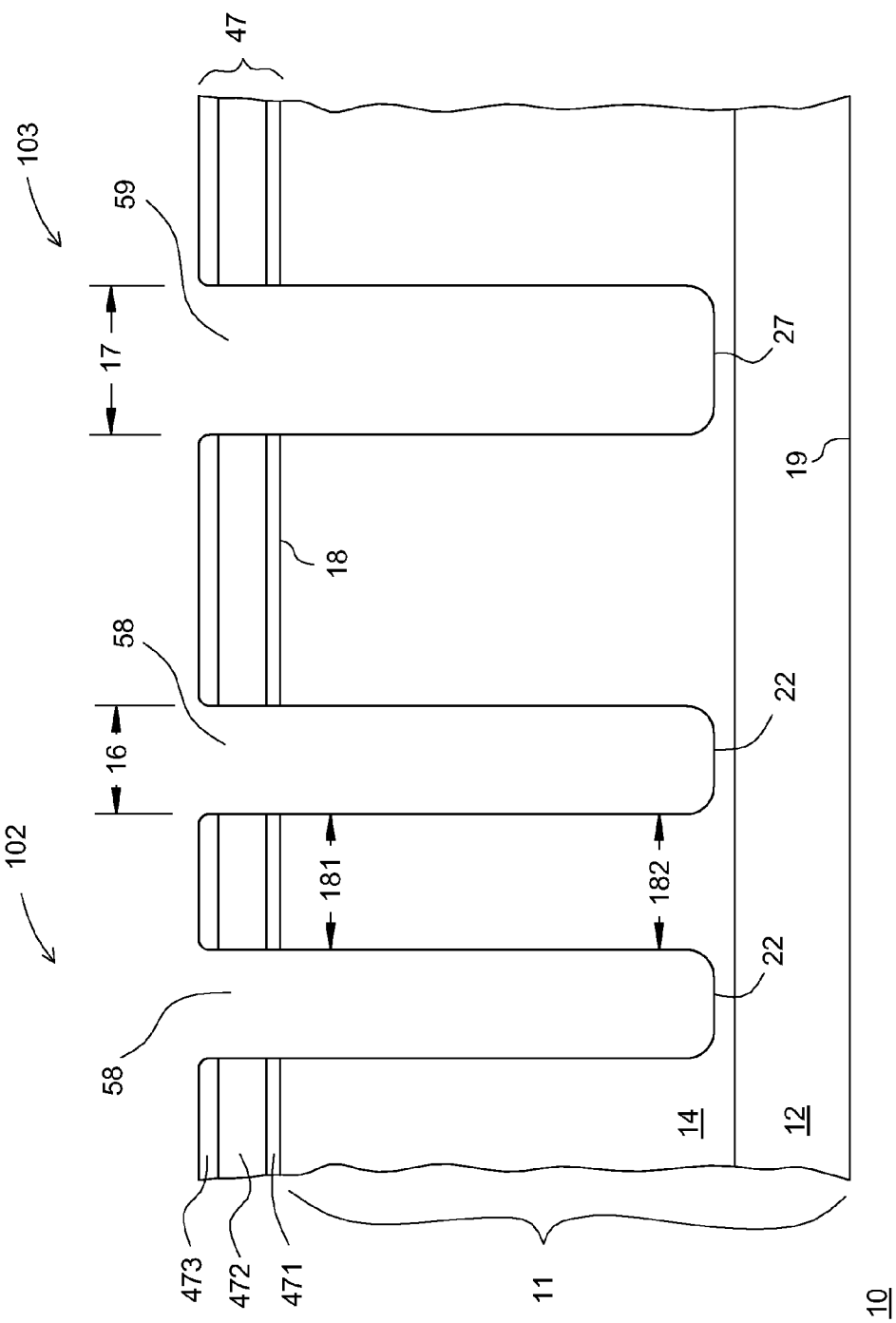
FIGS. 1-9 illustrate partial cross-sectional views of a semiconductor device at various stages of fabrication in accordance with a first embodiment of the present invention.

FIG. 1 illustrates a partial cross-sectional view of a semiconductor device 10 or cell 10 at an early stage of fabrication in accordance with a first embodiment. Device 10 includes a region of semiconductor material, semiconductor substrate, or semiconductor region 11, which can be, for example, an n-type silicon substrate 12 having a resistivity ranging from about 0.001 ohm-cm to about 0.005 ohm-cm. By way of example, substrate 12 can be doped with phosphorous, arsenic, or antimony. In the embodiment illustrated, substrate 12 provides a drain region, drain contact, or a first current carrying contact for device 10. In this embodiment, device 10 can include an active area 102 and a contact area 103 where contact can be made, for example, to shield electrode structures described hereinafter. Also, in this embodiment, device 10 can be configured as a vertical power MOSFET structure, but this description applies as well to insulated gate bipolar transistors (IGBT), MOS-gated thyristors, and other related or equivalent structures as known by one of ordinary skill in the relevant art.

A semiconductor layer, drift region, or extended drain region 14 can be formed in, on, or overlying substrate 12. In one embodiment, semiconductor layer 14 can be formed using semiconductor epitaxial growth techniques. Alternatively, semiconductor layer 14 can be formed using semiconductor doping and diffusion techniques. In an embodiment suitable for a 50 volt device, semiconductor layer 14 can be n-type with a dopant concentration of about $1.0 \times 10^{16}$ atoms/$cm^3$ to about $1.0 \times 10^{17}$ atoms/$cm^3$ and can have a thickness from about 3 microns to about 5 microns. The dopant concentration and thickness of semiconductor layer 14 can be increased or decreased depending on the desired drain-to-source breakdown voltage ($BV_{DSS}$) rating of device 10. In one embodiment, semiconductor layer 14 can have a graded dopant profile. In an alternate embodiment, the conductivity type of substrate 12 can be opposite to the conductivity type of semiconductor layer 14 to form, for example, an IGBT embodiment.

A masking layer 47 can be formed overlying a major surface 18 of region of semiconductor material 11. In one embodiment, region of semiconductor material 11 also includes major surface 19, which is opposite to major surface 18. In one embodiment, masking layer 47 can comprise a dielectric film or a film resistant to the etch chemistries used to form trenches described hereinafter. In one embodiment, masking layer 47 can include more than one layer including, for example, a dielectric layer 471 of 0.030 microns of thermal oxide, a dielectric layer 472 of about 0.2 microns of silicon nitride, and a dielectric layer 473 of about 0.1 microns of deposited oxide. In accordance with one embodiment, dielectric layer 472 can be configured to protect major surface 18 from encroachment effects in subsequent process steps that occur, for example, after trench structures are formed. This encroachment effect is a problem with related devices when thermal oxides are formed along upper surfaces of trench structures and in proximity to exposed portions of semiconductor layer 14 along major surface 18. The encroachment problem can cause an uneven dielectric layer along major surface 18, which can impact the dopant profiles of subsequently formed doped regions.

Openings 58 and 59 can then be formed in masking layer 47. In one embodiment, photoresist and etch processes can be used to form openings 58 and 59. In one embodiment, openings 58 can have a width 16 of about 0.2 microns to about 0.25 microns, and opening 59 can have a width 17 of about 0.4 microns to about 0.5 microns. In one embodiment, an initial spacing 181 between openings 58 can be about 0.55 microns to about 0.65 microns.

After openings 58 and 59 are formed, segments of semiconductor layer 14 can be removed to form trenches 22 and 27 extending from major surface 18. By way of example, trenches 22 and 27 can be etched using plasma etching techniques with a fluorocarbon chemistry (for example, $SF_6/O_2$). In one embodiment, trenches 22 and 27 can extend partially into semiconductor layer 14 leaving a portion of semiconductor layer between lower portions of trenches 22 and 27 and substrate 12. In one embodiment, trenches 22 and 27 can extend through semiconductor layer 14 and into substrate 12. In one embodiment, a sloped sidewall etch can be used with a slope of about 88 degrees to 89.5 degrees being one example. By way of example when using a $SF_6/O_2$ chemistry, the sloped sidewalls can be achieved by increasing the flow of $O_2$, which increases the sidewall Si—F—O passivant. When a sloped etch is used, trenches 22 can be separated by a distance 182 of about 0.6 microns to about 0.70 microns near the lower surfaces of trenches 22 as generally noted in FIG. 1. In one embodiment, trenches 22 and 27 can have a depth of about 1.5 microns to about 2.5 microns. In accordance with the present embodiment, trenches 22 can be configured as gate electrode and shield electrode trenches for the active devices of device 10 formed within active area 102, and trench 27 can be configured as a contact trench where external contact can be made to the shield electrodes within contact area 103. In one embodiment, contact area 103 can be located in a peripheral portion of device 10. In another embodiment, contact area 103 can be located in a centralized portion of device 10. In a further embodiment, a plurality of contact areas 103 can be used. For example, one can be located in a peripheral portion of device 10, and another can be located in a centralized portion of device 10.

Figure 2:
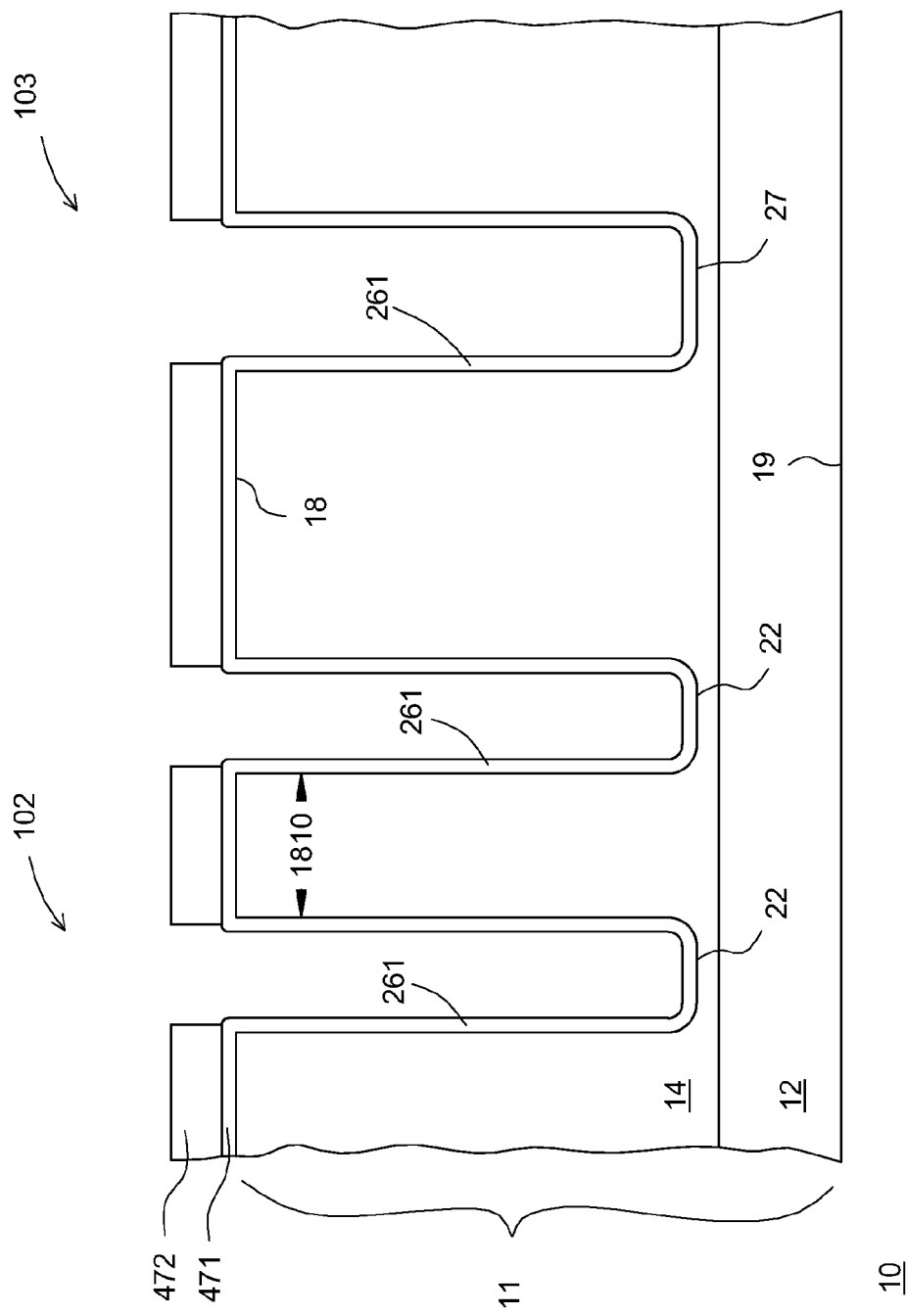

FIG. 2 illustrates a partial cross-sectional view of device 10 after additional processing. In an optional step, a sacrificial layer (not shown) is formed adjoining surfaces of trenches 22 and 27. By way of example, a thermal silicon oxide layer can be formed. Subsequently, the sacrificial layer and dielectric layer 473 can be removed using, for example, an etch process. A layer 261 of material can then be formed along surfaces of trenches 22 and 27. In one embodiment, layer 261 can be a dielectric or insulative material. By way of example, layer 261 can be about a 0.03 micron wet or thermal oxide layer. Portions of semiconductor layer 14 can be consumed during the formation of the thermal oxide, which reduces spacing 181 approximately by the thickness of the sacrificial layer (if used) and of layer 261 designated as reduced spacing or first reduction 1810. In one embodiment, first reduction 1810 can be about 0.5 to about 0.6 microns.

Figure 3:
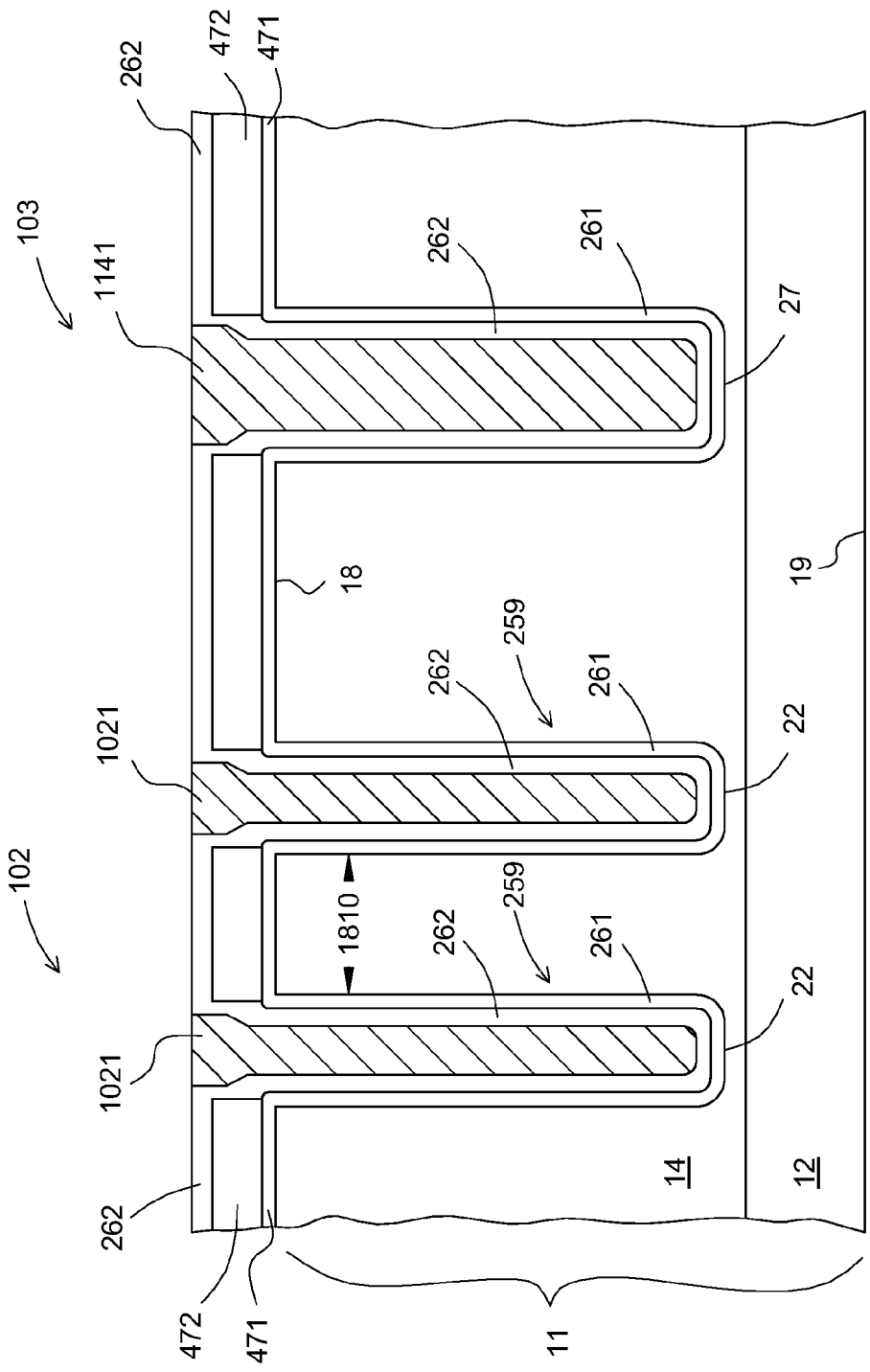

FIG. 3 illustrates a partial cross-sectional view of device 10 after further processing. A conformal layer 262 can be formed along layer 261 and sidewall portions of dielectric layer 472, and overlying dielectric layer 472. In one embodiment, conformal layer 262 can be a dielectric or insulative material. In one embodiment, conformal layer 262 can be a deposited oxide. By way of example, conformal layer 262 can have a thickness from about 0.05 microns to about 0.1 microns. In an alternate embodiment, conformal layer 262 can be formed by depositing a polysilicon layer and fully oxidizing it to convert it to a thermal oxide. In one embodiment, layers 261 and/or 262 are configured as a shield electrode dielectric layer or structure 259, which separate, insulate, or isolate the shield electrode (for example, element 21 illustrated in FIG. 17) from semiconductor layer 14 and substrate 12 (if trenches 22 adjoin substrate 12).

In one embodiment, a layer of material can be formed overlying major surface 18 and within trenches 22 and 27. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. In a subsequent step, the layer of material can be planarized to form intermediate structures 1021 and 1141 in trenches 22 and 27 respectively. In one embodiment, chemical mechanical polishing techniques can be used for the planarization step. When the layer of material includes crystalline semiconductor material, the layer of material can be heat treated before or after planarization to, for example, active and/or diffuse any dopant material present in the crystalline semiconductor material.

Figure 4:
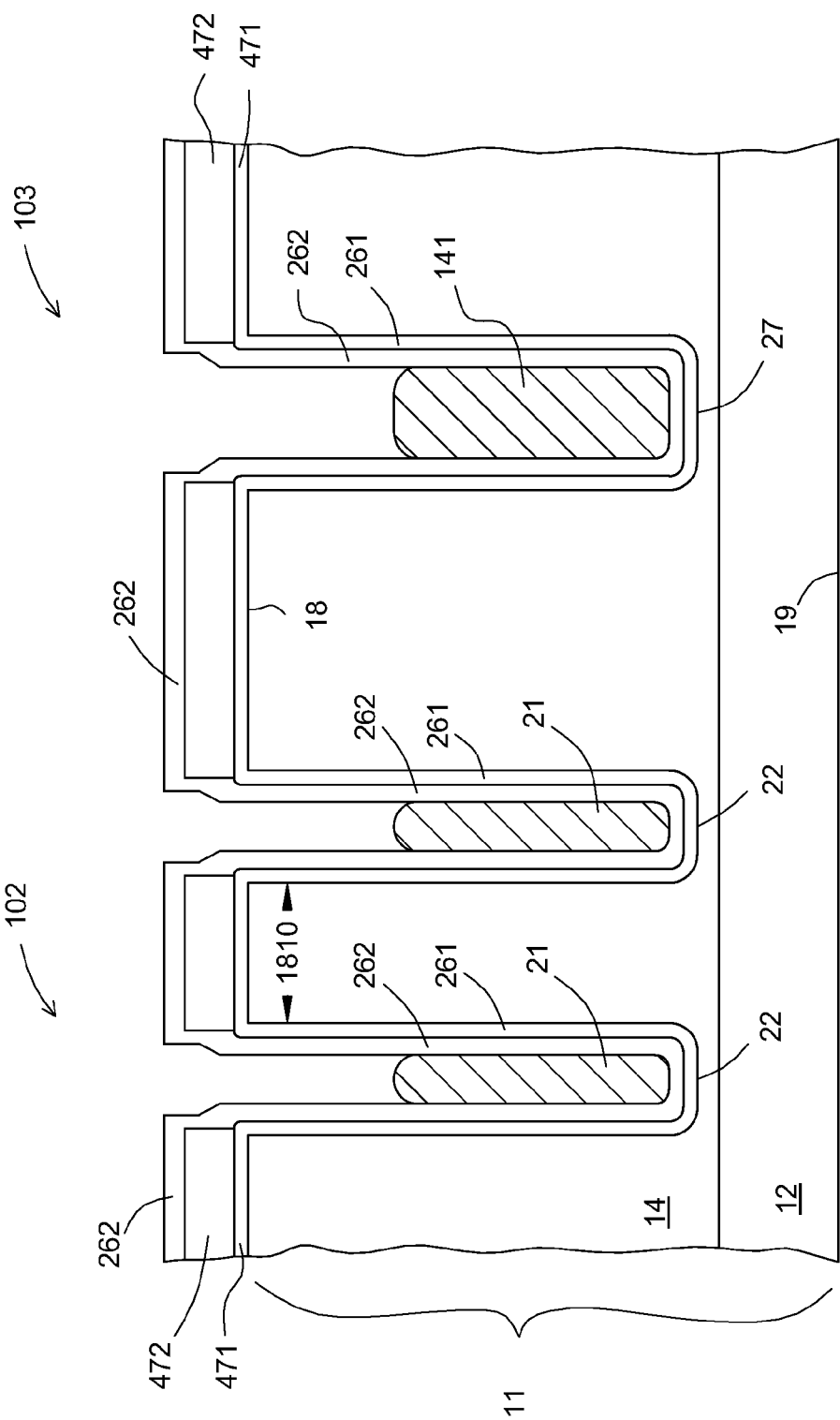
Figure 5:
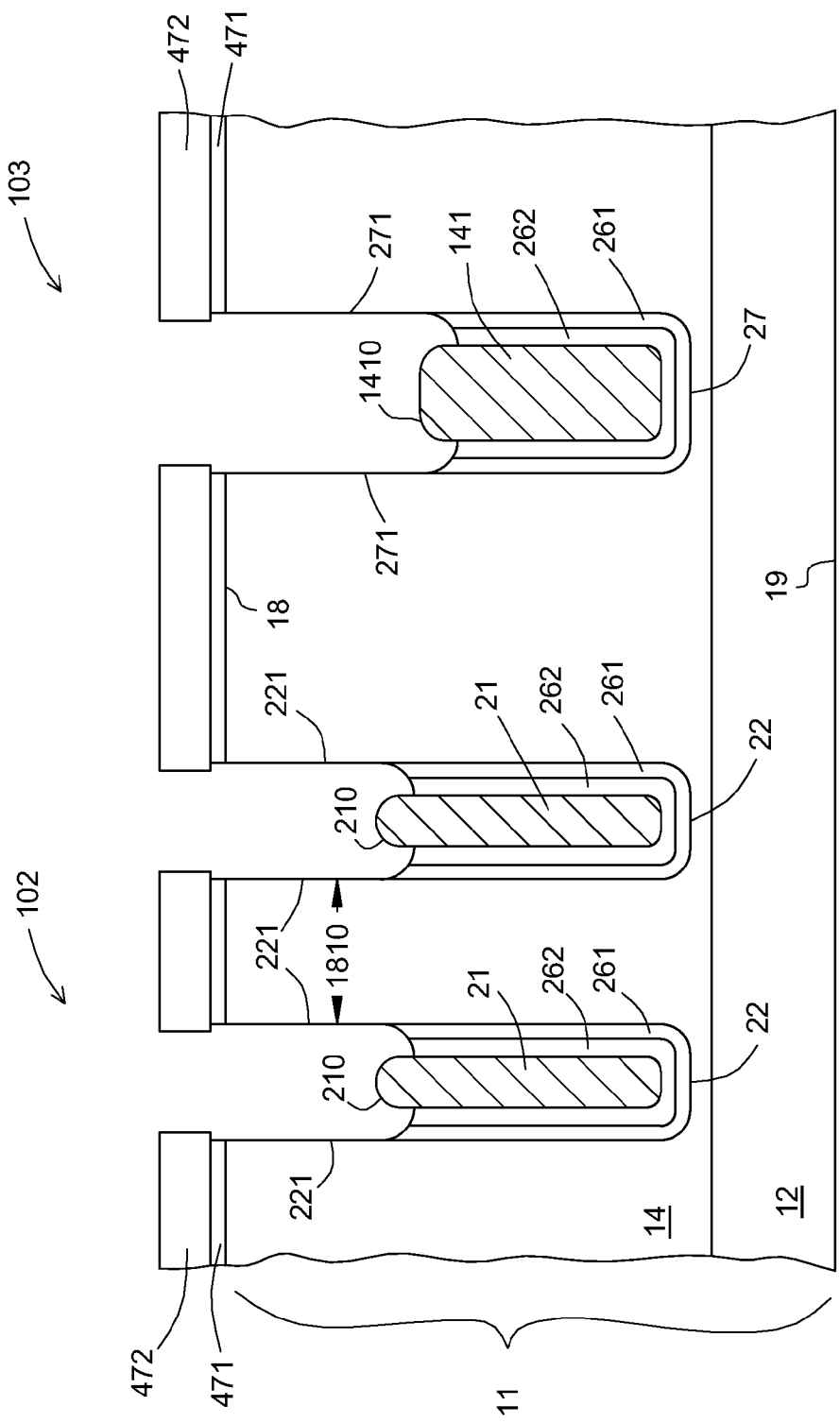

FIG. 4 illustrates a partial cross-sectional view of device 10 after more processing. For example, intermediate structures 1021 and 1141 can be further recessed within trenches 22 and 27 to form shield electrodes 21 and a shield electrode contact portion 141. As an example, a dry etch with a fluorine or chlorine based chemistry can be used for the recess step. In one embodiment, an etch step, such as a wet etch step can be used to remove conformal layer 262 overlying dielectric layer 472 and along sidewall portions of dielectric layer 472. The wet etch step can be used to further remove conformal layer 262 and layer 261 from upper sidewall portions or sidewall portions 221 of trenches 22, and from upper sidewall portions or sidewall portions 271 of trench 27 as illustrated in FIG. 5. In one embodiment, a buffered hydrofluoric (HF) acid can be used. The etch step can also expose portions 210 of shield electrodes 21 and portions 1410 of shield electrode contact portion 141 as illustrated, for example, in FIG. 5.

Figure 6:
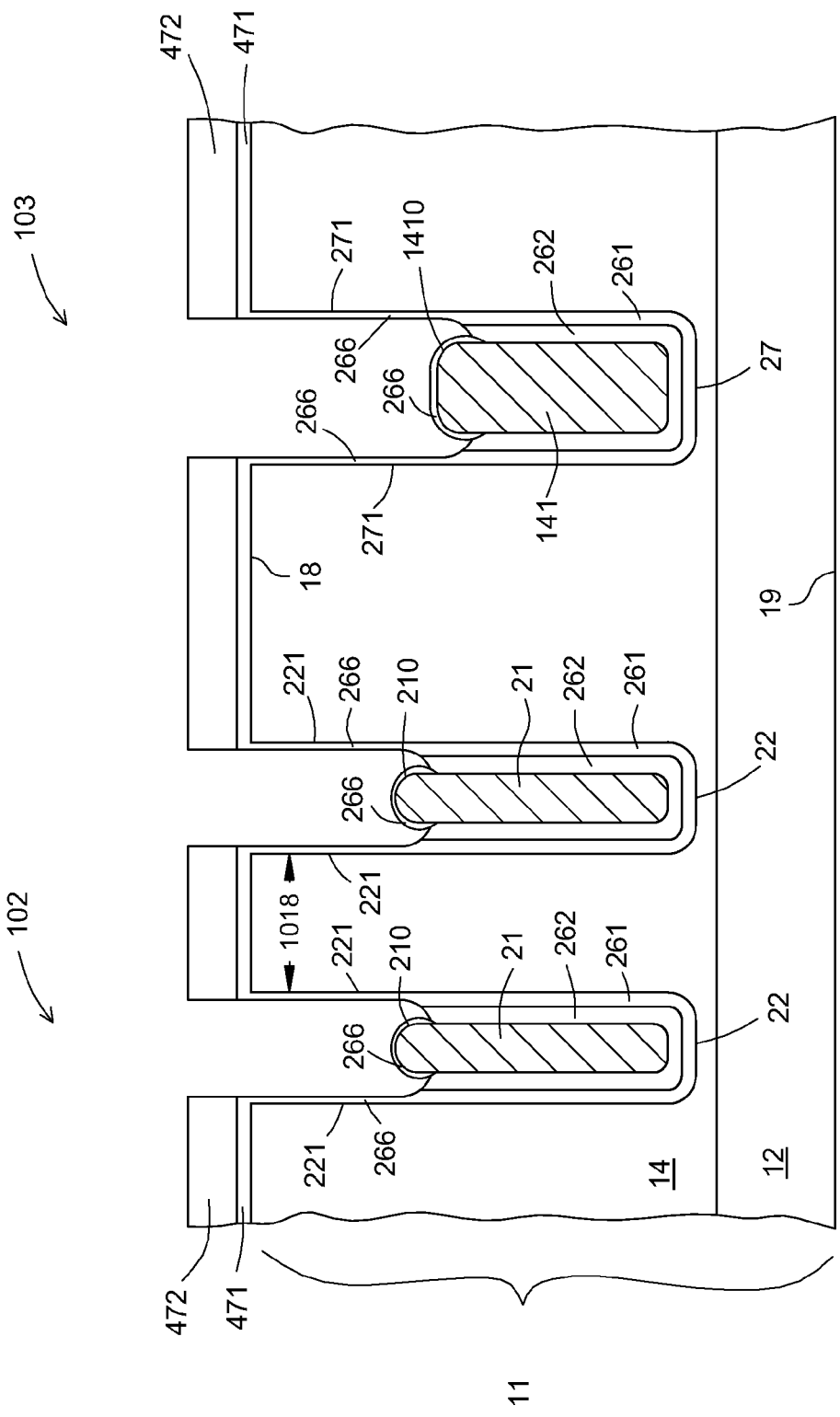
Figure 7:
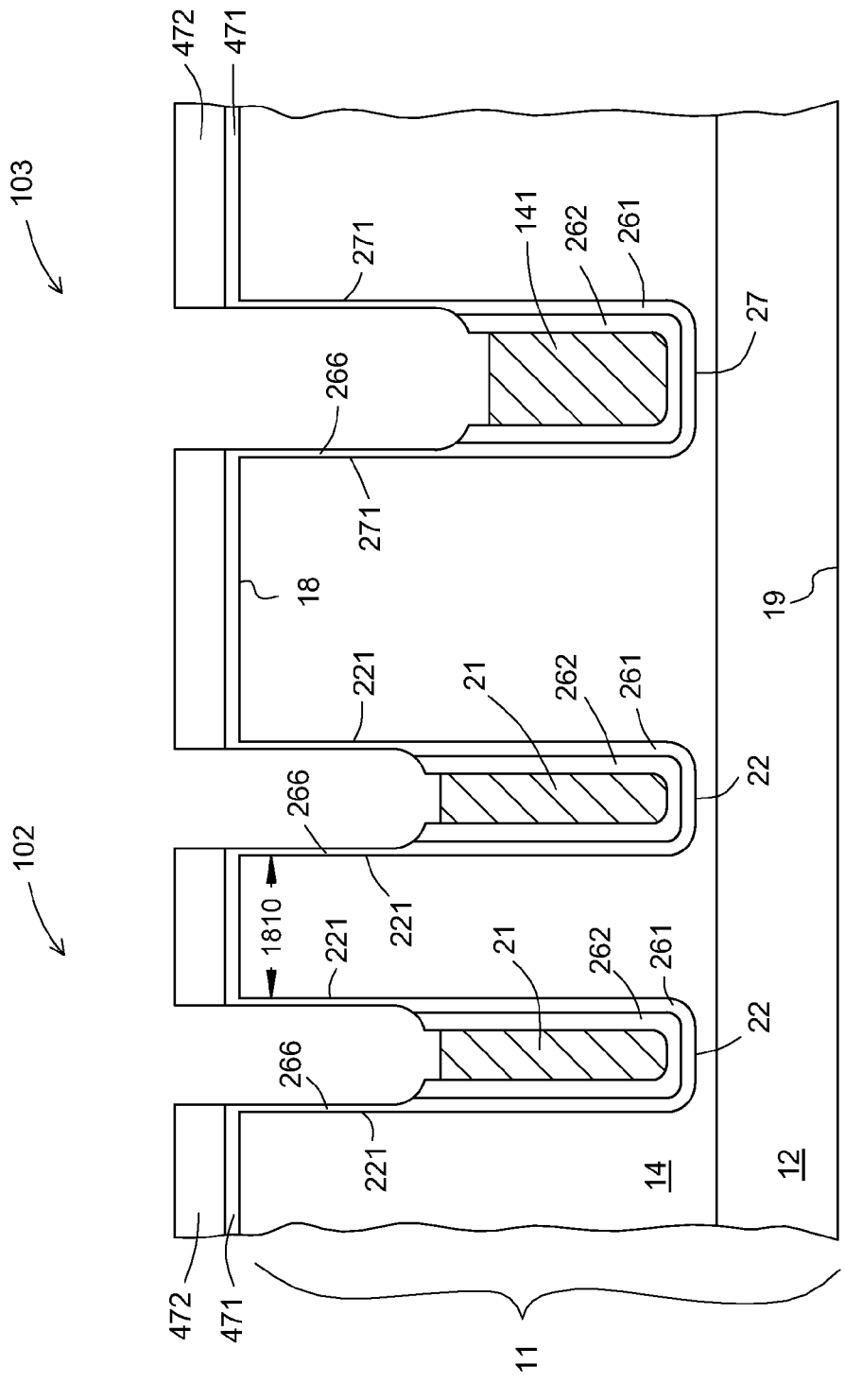

FIG. 6 illustrates a partial cross-sectional view of device 10 after additional processing. In one embodiment, a dielectric layer 266 can be formed along sidewall portions 221 and 271 and along exposed portions 210 and 1410. In one embodiment, dielectric layer 266 can be a thin sacrificial or thermal oxide layer, or another dielectric or insulative layer. In one embodiment, dielectric layer 266 can have a thickness of about 0.005 microns to about 0.01 microns. Subsequently, an etch step can be used to remove additional portions of shield electrodes 21 and shield electrode contact portion 141 as illustrated, for example, in FIG. 7. In one embodiment, portions of dielectric layer 266 that overlie shield electrodes 21 and shield electrode contact portion 141 can be removed with an initial break-through etch or removal step. By way of example, a fluorine based chemistry can be used for the break-through etch step, and a fluorine or chlorine based chemistry can be used for the recess etch step.

Figure 8:
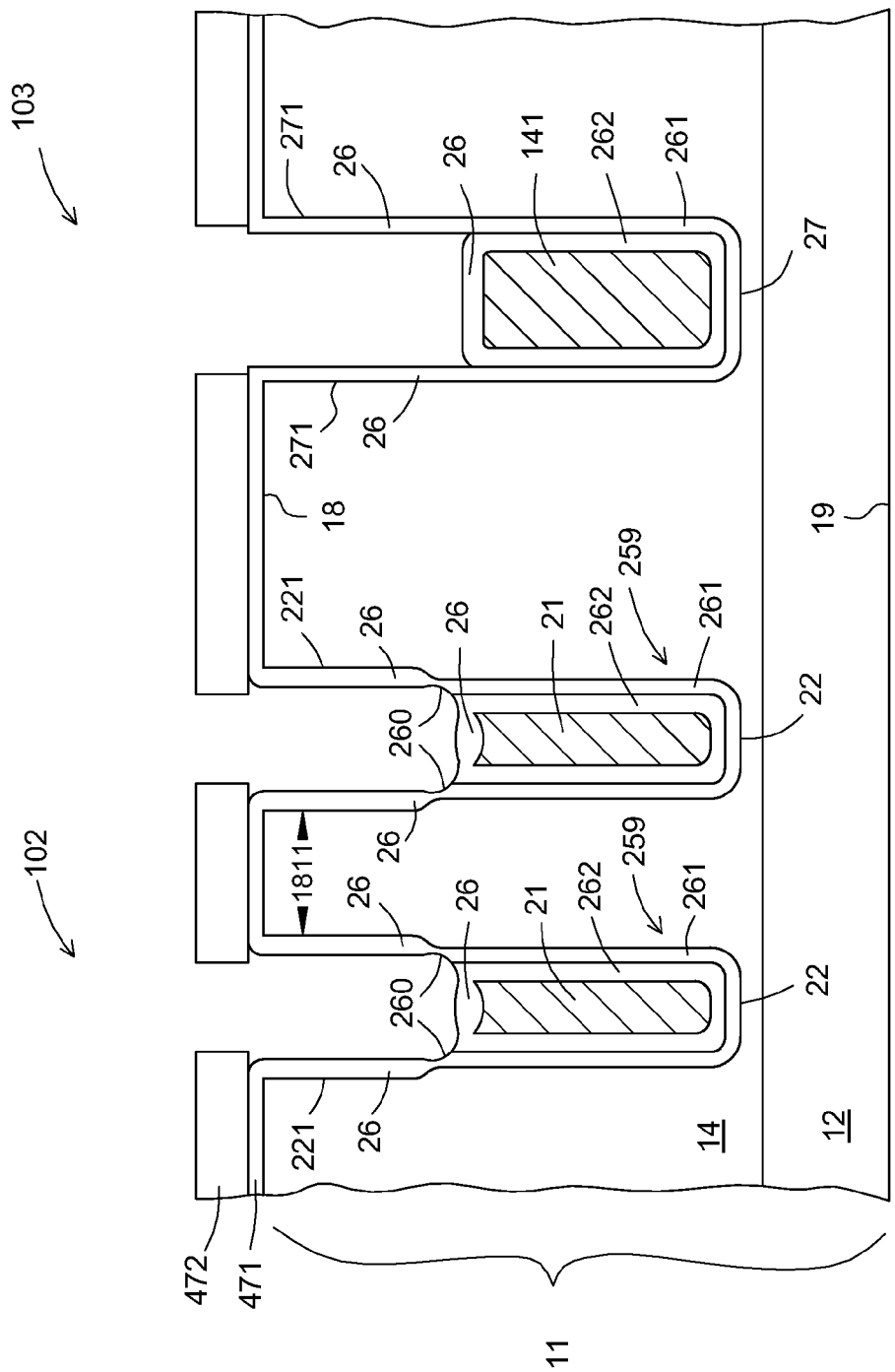

FIG. 8 illustrates a partial cross-sectional view of device 10 after further processing. In one embodiment, a removal step can be used to remove dielectric layer 266 and portions of layers 261 and 262. Subsequently, in accordance with the present embodiment, a dielectric layer is formed along sidewall portions 221 and 227 of trenches 22 and 27. In one embodiment, the dielectric layer can also be formed overlying portions of layers 261 and 262, shield electrode 21, and/or shield electrode contact 141. In accordance with the present embodiment, the dielectric layer forms gate layers or gate dielectric layers 26 along upper sidewall surfaces 221 of trenches 22. Gate layers 26 can be oxides, nitrides, tantalum pentoxide, titanium dioxide, barium strontium titanate, high k dielectric materials, combinations thereof, or other related or equivalent materials as known by one of ordinary skill in the art. In one embodiment, gate layers 26 can be silicon oxide and can have a thickness from about 0.01 microns to about 0.06 microns. Portions of semiconductor layer 14 can be further consumed in the formation of gate layers 26, which reduces spacing 181 approximately by the thickness of gate layers 26. This reduction in spacing 181 is designated as reduced spacing or second reduction 1811. In one embodiment, second reduction 1811 can be about 0.045 to about 0.055 microns.

With the presence of layers 261 and 262 along the lower sidewall portions of trenches 22, lower portions 260 of gate layers 26 in trenches 22 can be thinner than the upper portions of gate layers 26. This thinning effect is believed to be caused at least in part by stresses present in the various and different layers of material in proximity to where the thinning effect occurs. The gate dielectric layer thinning effect can lead to lower yields and/or impaired device performance.

Figure 9:
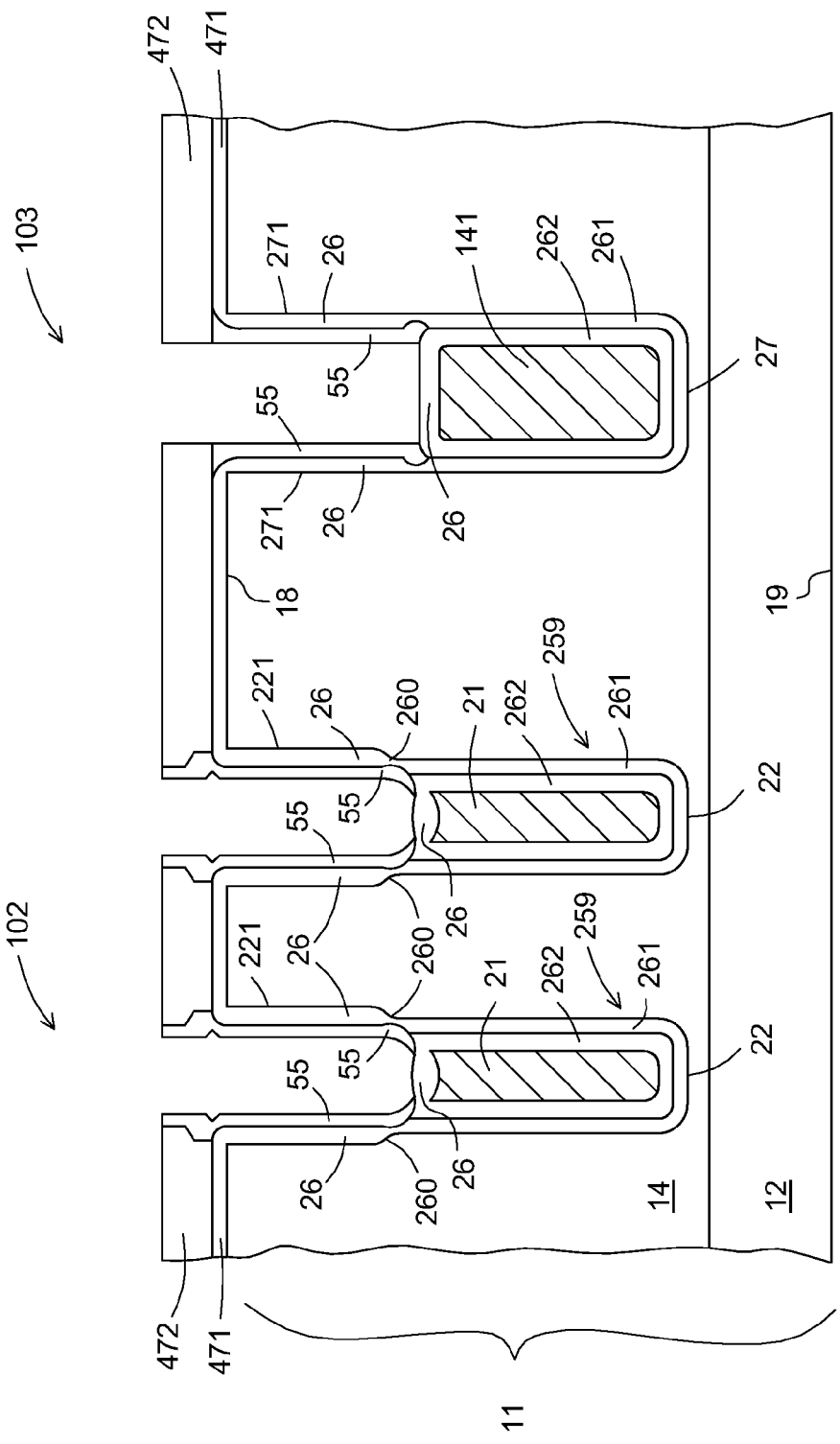

FIG. 9 illustrates a partial cross-sectional view of device 10 after additional processing. In a subsequent step, a layer of material is formed along gate layers 26 and overlying major surface 18. In one embodiment, the layer of material can be a material that is different than gate layers 26. In one embodiment, the layer of material can be an oxidation-resistant material. The layer of material can then be anisotropically etched to form spacer layers 55 along sidewall portions of gate layers 26 while leaving other portions of gate layers 26 exposed above shield electrodes 21 and shield electrode contact portion 141. In one embodiment, spacer layers 55 can be a nitride material, such as a deposited silicon nitride. In one embodiment, spacer layers 55 can have a thickness from about 0.015 microns to about 0.02 microns. In one embodiment, lower portions of spacer layers 55 adjoin lower portions 260 of gate layers 26 as illustrated, for example, in FIG. 9.

Figure 10:
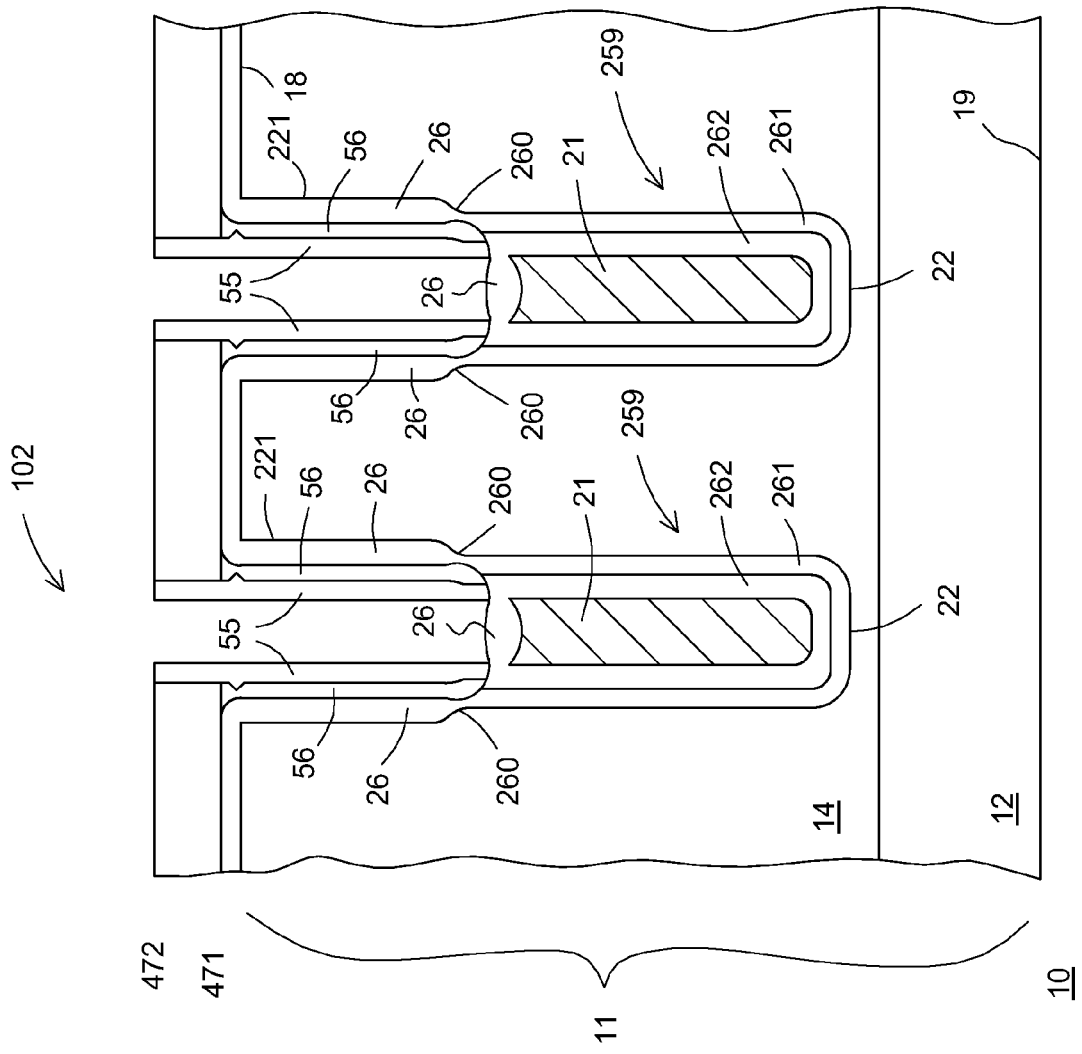
FIG. 10 illustrates a partial cross-sectional view of a semiconductor device in accordance with a second embodiment of the present invention at an intermediate step in fabrication.

FIG. 10 illustrates a partial cross-sectional view of device 10 in accordance with an alternative embodiment. In an alternative processing step, a layer of crystalline semiconductor material can be formed along gate layers 26 and overlying major surface 18 before the layer of material used to form spacer layers 55 is formed. The layer of material used to form spacer layers 55 can then be formed along the layer of crystalline semiconductor material. Both layers can then be anisotropically etched to form spacer layers 55 and 56 as illustrated, for example, in FIG. 10. Alternatively, the layer of crystalline semiconductor layer can be anisotropically etched before layers 55 are formed. In one embodiment, spacer layers 56 can comprise about 0.03 microns of polysilicon, and can be doped or undoped. In another embodiment, spacer layers 56 can comprise 0.03 microns of amorphous silicon, and can be doped or undoped.

Figure 11:
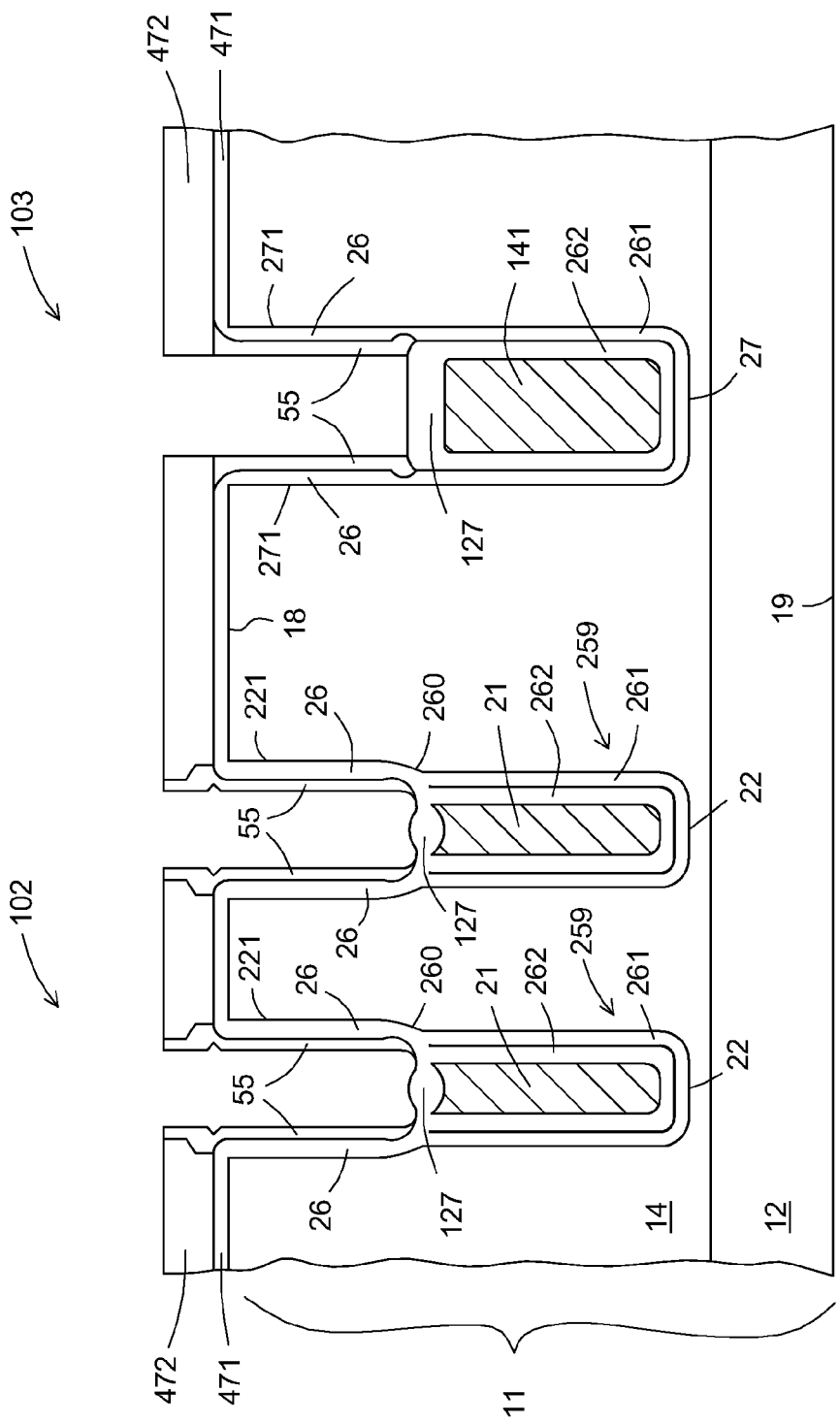
FIGS. 11-17 illustrate partial cross-sectional views of the semiconductor device of FIGS. 1-9 at further stages of fabrication in accordance with the first embodiment.

FIG. 11 illustrates a partial cross-sectional view of device 10 based on the FIG. 9 embodiment after additional processing. In accordance with the present embodiment, layers 127 can be formed adjacent shield electrodes 21 and shield electrode contact portion 141. In one embodiment, layers 127 can comprise a dielectric or insulative material, and are configured, for example, as interpoly dielectric layers or inter-electrode dielectric layers. In one embodiment, layers 127 can comprise a silicon oxide formed using wet or thermal oxidation techniques. In one embodiment, layers 127 can have a thickness from about 0.1 microns to about 0.3 microns. In accordance with the present embodiment, spacers 55 (and optionally 56) are configured to provide a localized oxidation effect that compensates for the thinning of gate layers 26 along lower portions 260. In one embodiment, layers 127 increase the thickness of the gate layers 26 in proximity to where gate layers 26 and shield dielectric structure 259 meet or adjoin.

In related devices where the gate dielectric layers are formed after the interpoly dielectric layer is formed, the gate thinning effect is not appropriately addressed, which can cause lower yields and/or impaired device performance. In the present embodiment, the dielectric layer used to form gate layer 26 is formed before interpoly dielectric layer 127 is formed, and in accordance with the present embodiment, the impact of the gate layer thinning effect is reduced with the localized oxidation process thereby improving, for example, performance and yields. Additionally, the thinning effect can be addressed while the interpoly dielectric is formed without added processing costs. Moreover, because gate layers 26 are formed before the formation of layers 127 and not later stripped and reformed as in related devices, the integrity of the interface between semiconductor layer 14 and gate layers 26 can be maintained, for example, by reducing exposure of the interface to contamination and/or damage.

Figure 12:
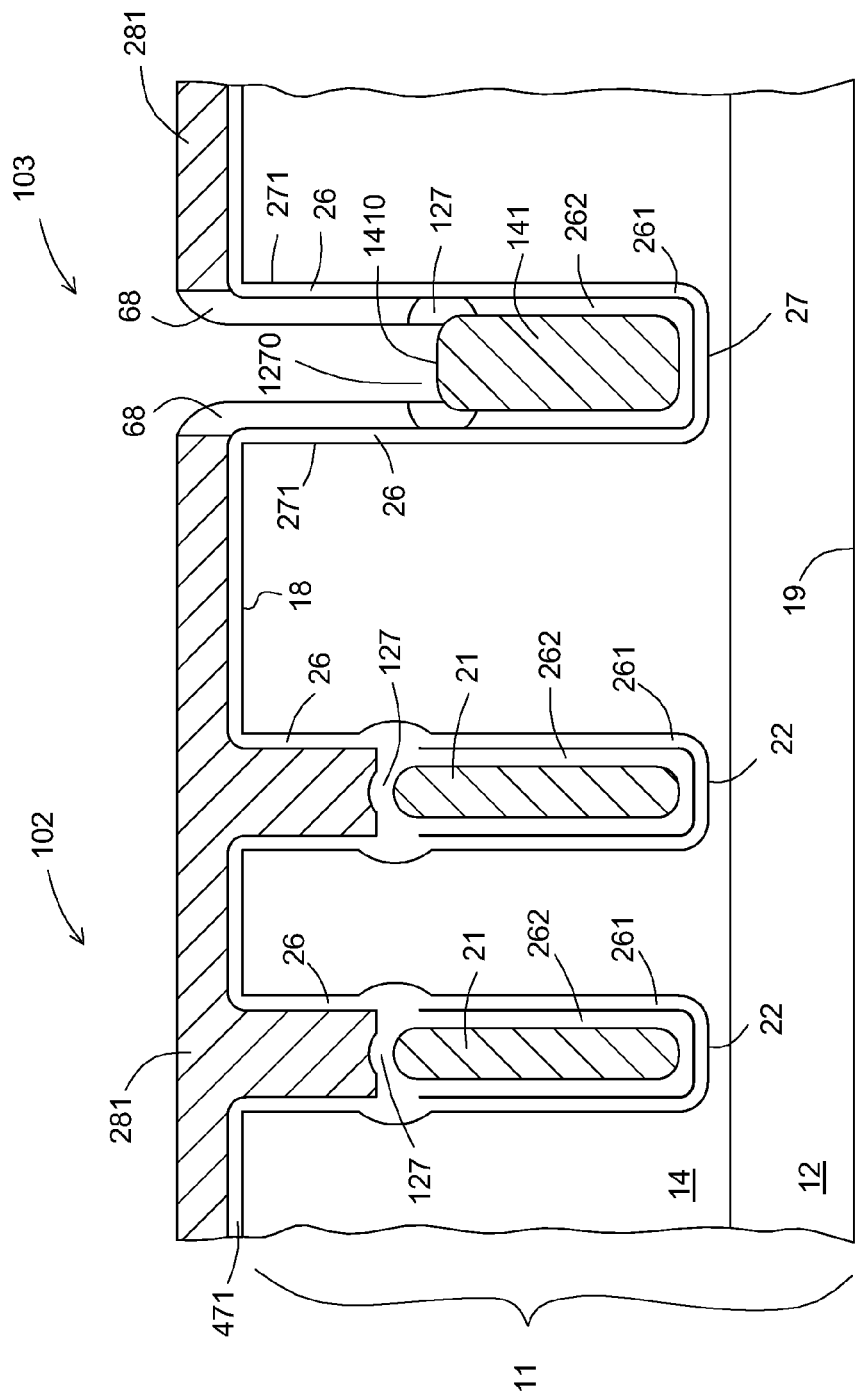

FIG. 12 illustrates a partial cross-sectional view of device 10 after further processing. In subsequent steps, spacers 55 (and 56 if present) can be removed. In one embodiment, dielectric layer 472 can also be removed. In an optional step, an oxidation process can be used to increase or add to the thickness of gate layers 26. Subsequently, a conductive or crystalline semiconductor layer 281 can be formed overlying major surface 18 and within trenches 22 and 27. In one embodiment, layer 281 can comprise doped polysilicon. In one embodiment, the polysilicon can be doped with an n-type dopant, such as phosphorous or arsenic. Subsequently, a masking layer (not shown) can be formed overlying major surface 18 and a removal step can be used to remove portions of layer 281 from within trench 27. The masking layer can then be removed.

Figure 13:
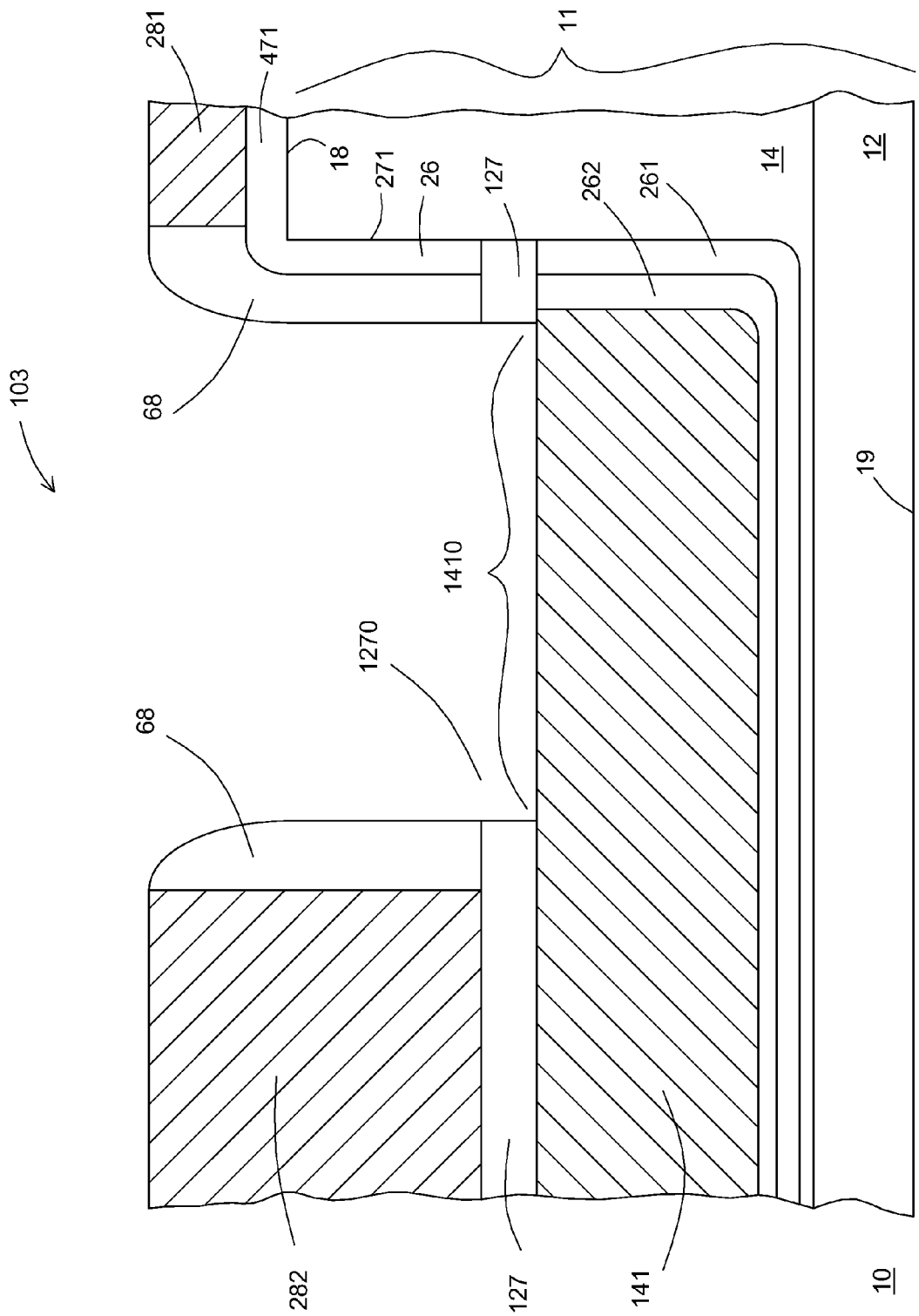

In accordance with the present embodiment, a layer of material can be formed overlying major surface 18 and along upper portions or portions of trench 27. In one embodiment, the layer of material can be a dielectric or insulative material. In one embodiment, the layer of material can comprise a deposited oxide, and can have a thickness from about 0.08 microns to about 0.12 microns. The layer of material can then be anisotropically etched to form spacer layers 68 within trench 27. The anisotropic etch step can also remove portions of layer 127 to form an opening 1270 in layer 127 in trench 27 to expose a portion of shield contact portion 141. In accordance with the present embodiment, shield contact portion 141 is configured to provide a flat or horizontal portion 1410 for making subsequent contact to another shield electrode portion 142 (illustrated in FIG. 14). In one embodiment, flat portion 1410 can be generally oriented parallel to major surface 19 of substrate 12. In one embodiment, flat portion 1410 can be generally oriented perpendicular to sidewall portions 271 of trench 27. Flat portion 1410 is further illustrated in FIG. 13, which is a 90 degree rotation of contact area 103 of device 10. In one embodiment, flat portion 1410 terminates in a recessed configuration within trench 27 in contact area 103. Flat portion 1410 is an improvement over related devices where the shield contact structure curves upwards to major surface 18 as single or continuous structure. In related devices, the formation of the curved portion of the shield contact structure was found to cause yield issues. FIG. 13 further illustrates a gate electrode contact portion 282, which can also be formed in contact area 103 and is configured for providing external electrical connection to gate electrodes 28 within active portion 102 of device 10. In one embodiment, gate electrode contact portion 282 can be formed as part of layer 281.

Figure 14:
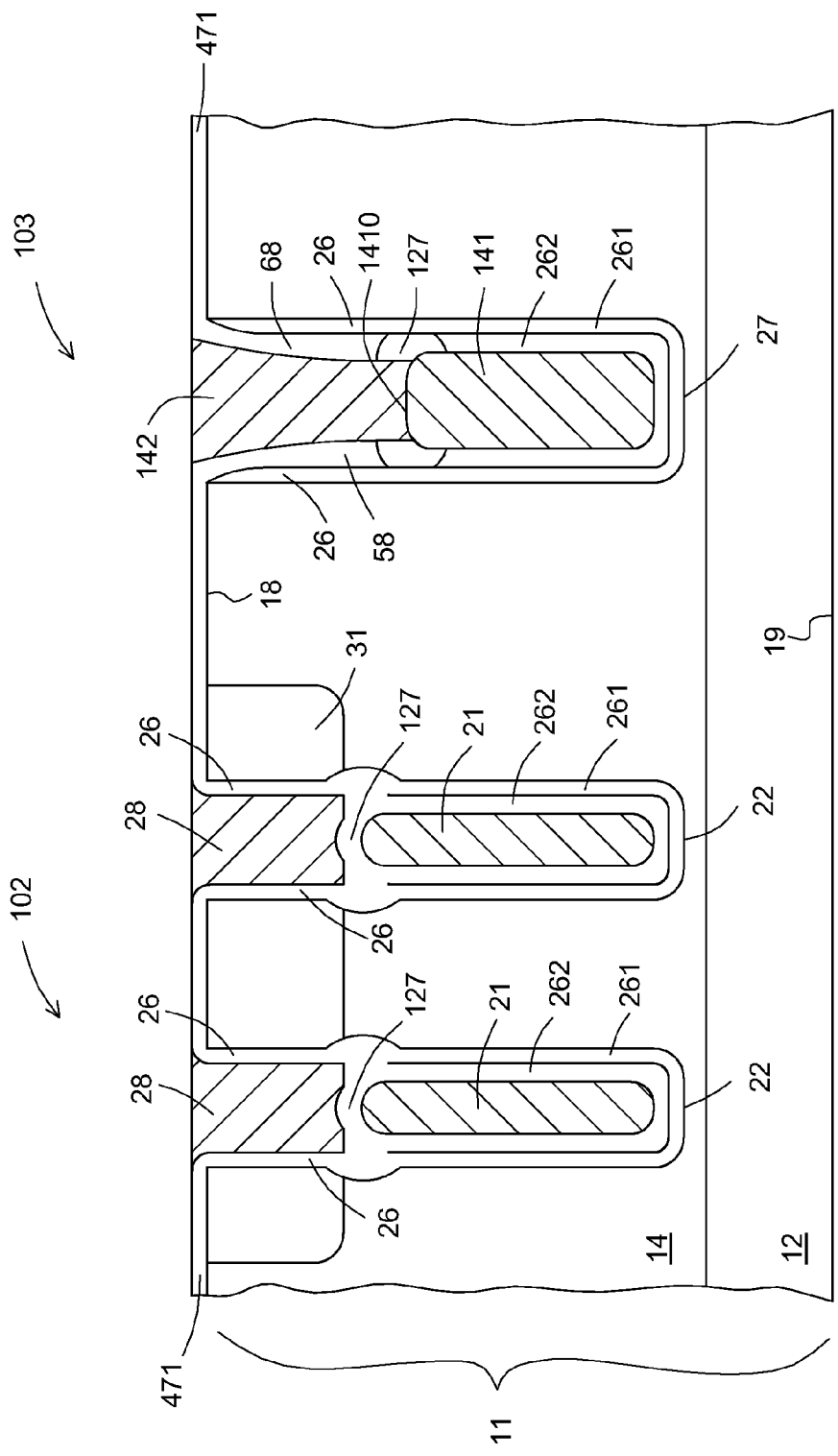

FIG. 14 illustrates a partial cross-sectional view of device 10 after further processing. A layer of material can be formed overlying major surface 18 and within trench 27. In one embodiment, the layer of material can comprise crystalline semiconductor material, a conductive material, or combinations thereof. In one embodiment, the layer of material can comprise doped polysilicon. In one embodiment, the polysilicon can be doped with an n-type dopant, such as phosphorous or arsenic. Subsequently, the layer of material can be planarized using dielectric layer 471 as a stop layer. In one embodiment, chemical mechanical planarization can be used for the planarization step. The planarization step can be used to form shield contact portion 142, which in accordance with the present embodiment contacts shield contact portion 141 along flat portion 1410. In addition, the planarization step can form gate electrodes 28 within trenches 22 as illustrated, for example, in FIG. 14.

Subsequently, a masking layer (not shown) can be formed overlying contact area 103, and body, base, or doped regions 31 can be formed extending from major surface 18 adjacent to trenches 22. Body regions 31 can have a conductivity type that is opposite to the conductivity type of semiconductor layer 14. In one embodiment, body regions 31 can have p-type conductivity, and can be formed using, for example, a boron dopant source. Body regions 31 have a dopant concentration suitable for forming inversion layers that operate as conduction channels or channel regions 45 (illustrated, for example, in FIG. 17) of device 10. Body regions 31 can extend from major surface 18 to a depth, for example, from about 0.5 microns to about 2.0 microns. It is understood that body regions 31 can be formed at an earlier stage of fabrication, for example, before trenches 22 are formed. Body regions 31 can be formed using doping techniques, such as ion implantation and anneal techniques.

Figure 15:
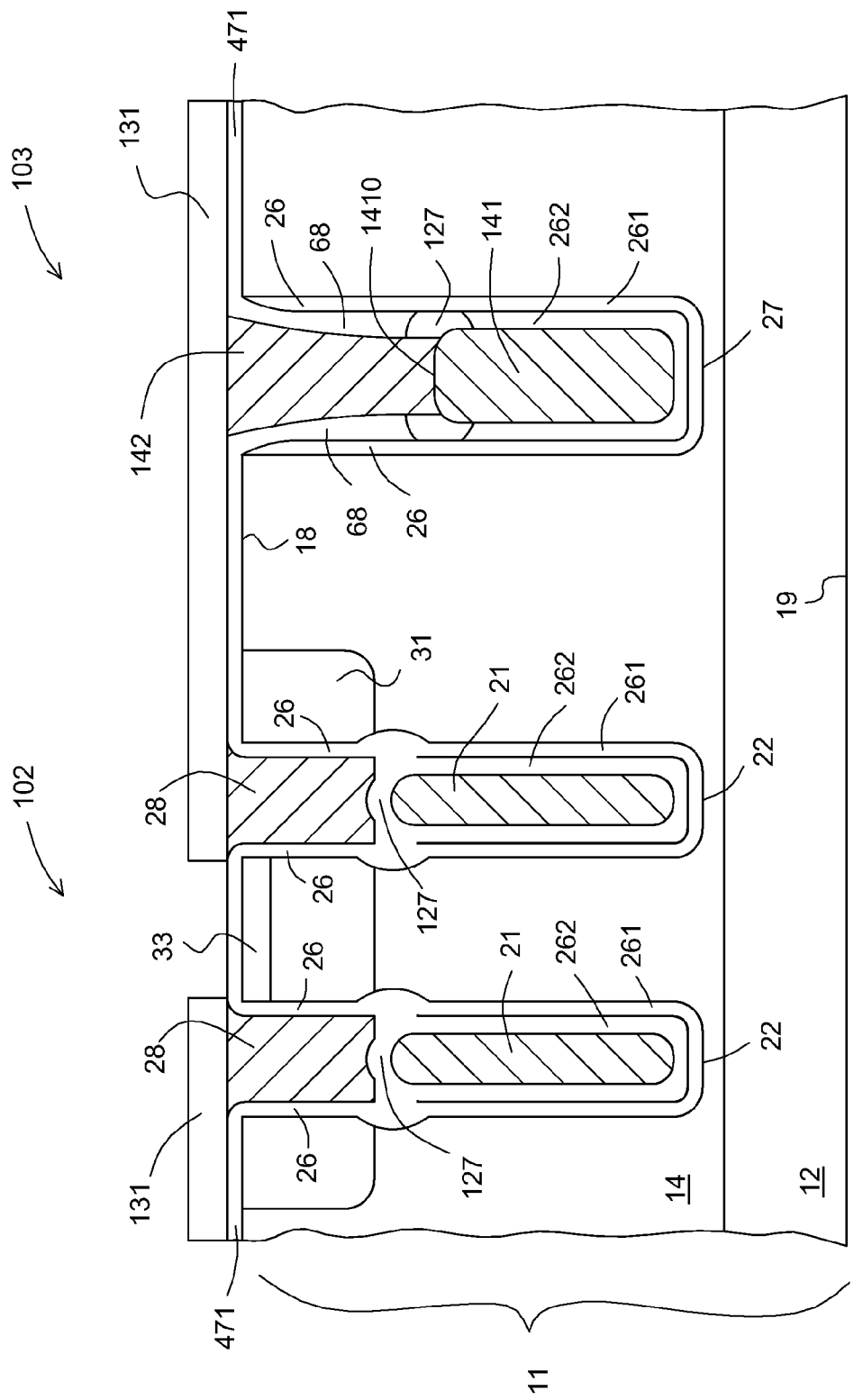

FIG. 15 illustrates a partial cross-sectional view of device 10 after additional processing. In a subsequent step, a masking layer 131 can be formed overlying portions of major surface 18. In one embodiment, source regions, current conducting regions, or current carrying regions 33 can be formed within, in, or overlying body regions 31, and can extend from major surface 18 to a depth, for example, from about 0.1 microns to about 0.5 microns. In one embodiment, source regions 33 can have n-type conductivity, and can be formed using, for example, a phosphorous or arsenic dopant source. In one embodiment, an ion implant doping process can be used to form source regions 33 within body regions 31. Masking layer 131 can then be removed, and the implanted dopant can be annealed.

Figure 16:
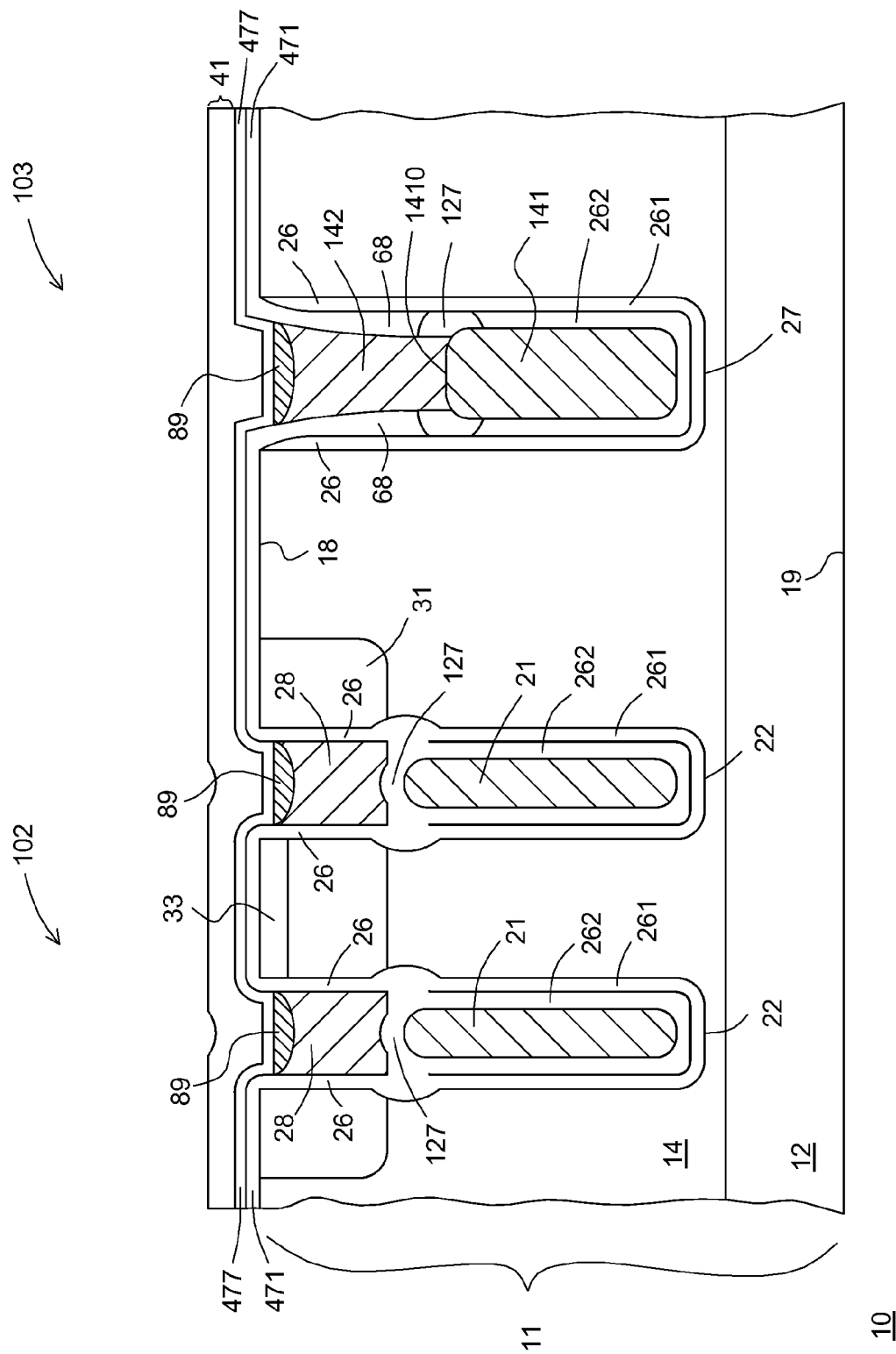

Gate electrodes 28 and shield electrode contact portion 142 can be recessed below major surface 18 as illustrated in FIG. 16. In one embodiment, about 0.15 microns to about 0.25 microns of material can be removed as a result of the recessing step. In an optional step, enhancement or conductive regions 89 can be formed within upper surfaces of gate electrodes 28 and/or shield electrode contact portion 142. In one embodiment, conductive regions 89 can be self-aligned silicide structures. In one embodiment, conductive regions 89 can be a cobalt silicide. A layer of material 477 can then formed overlying major surface 18, gate electrode 28, and shield electrode contact portion 142. In one embodiment, layer of material 477 can be a dielectric or insulative material. In one embodiment, layer of material 477 can be a nitride layer, such as a deposited silicon nitride layer, and can have thickness of about 0.05 microns.

In one embodiment, a layer or layers 41 can be formed overlying major surface 18. In one embodiment, layers 41 comprise dielectric or insulative layers, and can be configured as an inter-layer dielectric (ILD) structure. In one embodiment, layers 41 can be silicon oxides, such as doped or undoped deposited silicon oxides. In one embodiment, layers 41 can include at least one layer of deposited silicon oxide doped with phosphorous or boron and phosphorous, and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Figure 17:
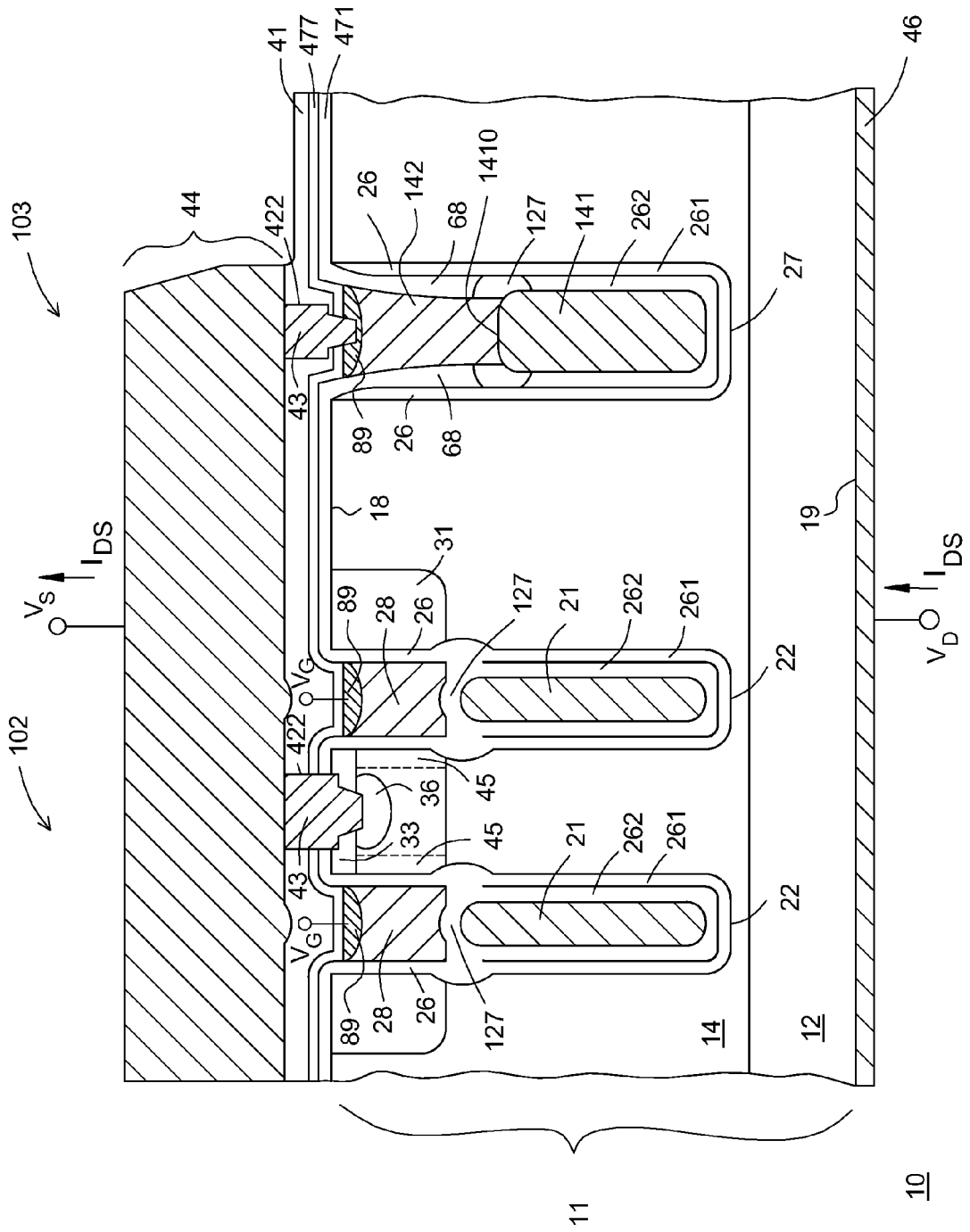

Subsequently, a masking layer (not shown) can be formed overlying device 10, and openings, vias, or contact trenches 422 can be formed for making contact to source regions 33, body regions 31, and shield contact portion 142 as illustrated, for example, in FIG. 17. In one embodiment, the masking layer can be removed, and a recess etch can be used to remove portions of source regions 33 and portions of shield contact portion 142. The recess etch step can expose portions of body regions 31 below source regions 33. A p-type body contact, enhancement region, or contact region 36 can then be formed in body regions 31, which can be configured to provide a lower contact resistance to body regions 31. Ion implantation (for example, using boron) and anneal techniques can be used to form contact regions 36.

Conductive regions 43 can then be formed in contact trenches 422 and configured to provide for electrical contact to source regions 33, body regions 31 through contact regions 36, and shield electrode contact portion 142. In one embodiment, conductive regions 43 can be conductive plugs or plug structures. In one embodiment, conductive regions 43 can include a conductive barrier structure or liner and a conductive fill material. In one embodiment, the barrier structure can include a metal/metal-nitride configuration, such as titanium/titanium-nitride or other related or equivalent materials as known by one of ordinary skill in the art. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18, and a conductive layer 46 can be formed overlying major surface 19. Conductive layers 44 and 46 typically are configured to provide electrical connection between the individual device components of device 10 and a next level of assembly. In one embodiment, conductive layer 44 can be titanium/titanium-nitride/aluminum-copper or other related or equivalent materials as known by one of ordinary skill in the art, and is configured as a source electrode or terminal. In one embodiment, conductive layer 46 can be a solderable metal structure, such as titanium-nickel-silver, chromium-nickel-gold, or other related or equivalent materials as known by one of ordinary skill in the art, and is configured as a drain electrode or terminal. In one embodiment, a further passivation layer (not shown) can be formed overlying conductive layer 44. In one embodiment, all or a portion of shield electrodes 21 can be connected to conductive layer 44 so that shield electrodes 21 are configured to be at the same potential as source regions 33 when device 10 is in use. In another embodiment, shield electrodes 21 can be configured to be independently biased or coupled in part to gate electrodes 28.

In one embodiment, the operation of device 10 can proceed as follows. Assume that source electrode (or input terminal) 44 and shield electrodes 21 are operating at a potential $V_S$ of zero volts, gate electrodes 28 would receive a control voltage $V_G$ of 4.5 volts, which is greater than the conduction threshold of device 10, and drain electrode (or output terminal) 46 would operate at a drain potential $V_D$ of less than 2.0 volts. The values of $V_G$ and $V_S$ would cause body regions 31 to invert adjacent gate electrodes 28 to form channels 45, which would electrically connect source regions 33 to semiconductor layer 14. A device current $I_{DS}$ would flow from drain electrode 46 and would be routed through semiconductor layer 14, channels 45, and source regions 33 to source electrode 44. In one embodiment, $I_{DS}$ is on the order of 10.0 amperes. To switch device 10 to the off state, a control voltage $V_G$ that is less than the conduction threshold of device 10 would be applied to gate electrodes 28 (e.g., $V_G$<1.0 volts). Such a control voltage would remove channels 45 and $I_{DS}$ would no longer flow through device 10. In accordance with the present embodiment, gate layers 26 are formed before interpoly dielectric layers 127. The method subsequently used to form interpoly dielectric layers 127 reduces the gate layer thinning effect, which improves yields and device performance. Also, by using a multi-portioned shield contact structure (for example, elements 141 and 142) and a flat portion (for example, element 1410), an improved shield electrode contact structure is formed for providing electrical contact to shield electrodes 21, which improves yields and performance.

The foregoing method and structure provides several advantages over related devices. For example, the method and structure can facilitate a die shrink to about 0.8 microns or less, which can improve performance parameters, such as specific on-resistance. Also, the method and structure facilitates higher yield and improved shield electrode contact integrity compared to related devices.

From all of the foregoing, one skilled in the art can determine that according to one embodiment, a method for forming an electrode contact structure comprises the steps of providing a region of semiconductor material (for example, element 11) having a major surface (for example, element 18). The method includes forming a contact trench (for example, element 27) extending from the major surface into the region of semiconductor material and forming a first dielectric layer (for example, element 261, 262) along surfaces of the contact trench. The method includes forming a first electrode contact portion (for example, element 141) adjacent the first dielectric layer, wherein the first electrode contact portion is recessed below the first major surface. The method includes forming a second dielectric layer (for example, element 127) overlying the first electrode contact portion. The method includes forming spacers (for example, element 68) along upper sidewall surfaces (for example, element 271) of the contact trench. The method includes forming an opening (for example, element 1270) in the second dielectric layer aligned to the spacers. The method includes forming a second electrode contact portion (for example, element 142) within the contact trench adjacent the spacers and contacting the first electrode contact portion within the contact trench.

Those skilled in the art will also appreciate that according to another embodiment, the method can further include the steps of forming a first conductive layer within the contact trench, and removing portions of the first conductive layer while leaving another portion of the first conductive layer (for example, element 141) within a lower portion of the contact trench, wherein the removing step forms the first electrode contact portion with a horizontal portion (for example, element 1410), and wherein the step of forming the second electrode contact portion includes forming the second contact portion so that the second contact portion makes contact to the first electrode contact portion along the horizontal portion.

Those skilled in the art will also appreciate that according to another embodiment, the method can further include the steps of forming a third dielectric layer (for example, element 26) along upper surfaces (for example, element 271) of the contact trench and overlying the first electrode contact portion, and forming oxidation-resistant spacers (for example, element 55) along the third dielectric layer, wherein the step of forming the second dielectric layer comprises forming the second dielectric layer using localized oxidation.

Those skilled in the art will also appreciate that according to another embodiment, the method can further include the steps of forming an inter-layer dielectric (for example, element 41) overlying the major surface, forming an opening (for example, element 422) in the interlayer dielectric aligned to the second electrode contact portion, and forming a conductive plug (for example, element 43) in the opening and contacting the second electrode contact portion.

Those skilled in the art will also appreciate that according to still another embodiment a method for forming a semiconductor device comprises the steps of providing a region of semiconductor material (for example, element 11) having first and second opposing major surfaces (for example, elements 18, 19). The method includes forming a contact trench (for example, element 27) extending from the first major surface into the region of semiconductor material. The method includes forming a first dielectric layer (for example, element 261, 262) along surfaces of the contact trench. The method includes forming a first shield electrode contact portion (for example, element 141) adjacent the first dielectric layer, wherein the first electrode contact portion is recessed below the first major surface and includes a flat portion (for example, element 1410) parallel to the second major surface. The method includes forming a second dielectric layer (for example, element 127) overlying the first electrode contact portion. The method includes forming an opening (for example, element 1270) in the second dielectric layer. The method includes forming a second shield electrode contact portion (for example, element 142) within the contact trench contacting the first electrode contact portion within the contact trench and along the flat portion.

Those skilled in the art will also appreciate that according to another embodiment, the method can further comprise the steps of forming a third dielectric layer (for example, element 26) along upper surfaces of the contact trench and overlying the first electrode contact portion, and forming oxidation-resistant spacers (for example, element 55) along the third dielectric layer, wherein the step of forming the second dielectric layer comprises forming the second dielectric layer using localized oxidation.

Those skilled in the art will also appreciate that according to another embodiment, the method can further include the steps of recessing the second electrode contact portion within the contact trench below the first major surface, forming a conductive region (for example, element 89) in an upper portion of the second electrode contact portion, forming an inter-layer dielectric (for example, element 41) overlying the major surface, forming an opening (for example, element 422) in the interlayer dielectric aligned to the second electrode contact portion, and forming a conductive plug (for example, element 43) in the opening and contacting the second electrode contact portion.

Those skilled in the art will also appreciate that according to yet another embodiment, a method of forming a semiconductor device having a shield electrode comprises the steps of providing a region of semiconductor material (for example, element 11) having first and second opposing major surfaces (for example, element 18, 19). The method includes forming a contact trench (for example, element 27) extending from the first major surface into the region of semiconductor material. The method includes forming a first dielectric layer (for example, element 261, 262) along surfaces of the contact trench. The method includes forming a first shield electrode contact portion (for example, element 141) adjacent the first dielectric layer, wherein the first electrode contact portion is recessed below the first major surface and includes a portion (for example, element 1410) parallel to the second major surface. The method includes forming oxidation-resistant spacers (for example, element 55) along upper sidewall surfaces of the contact trench. The method includes forming a second dielectric layer (for example, element 127) overlying the first electrode contact portion using localized oxidation. The method includes forming an opening (for example, element 1270) in the second dielectric layer. The method includes forming a second shield electrode contact portion (for example, element 142) within the contact trench contacting the first electrode contact portion within the contact trench and along the portion parallel to the second major surface.

Those skilled in the art will also appreciate that according to another embodiment, the method can further comprise the step of forming dielectric spacers (for example, element 68) along the upper sidewall surfaces of the contact trench before the step of forming the opening in the second dielectric layer, wherein the step of forming the opening includes forming the opening self-aligned to the spacers, and wherein the step of forming the second electrode contact portion includes forming the second electrode contact portion adjacent the dielectric spacers.

Those skilled in the art will also appreciate that according to another embodiment, the method can further comprise the step of forming a third dielectric layer (for example, element 26) along the upper sidewall surfaces of the contact trench before the step of forming the oxidation-resistant spacers.

Those skilled in the art will also appreciate that according to yet a further embodiment, an electrode contact structure comprises a region of semiconductor material (for example, element 11) having first and second opposing major surfaces (for example, elements 18, 19), wherein the region of semiconductor material includes an active area (for example, 102) and a contact area (for example, element 103). The structure includes a contact trench (for example, element 27) extending from the first major surface into the region of semiconductor material. The structure includes a first dielectric layer (for example, element 261, 262) formed along surfaces of the contact trench, and a first shield electrode contact portion (for example, element 141) formed adjacent the first dielectric layer, wherein the first electrode contact portion is recessed below the first major surface and includes a flat portion (for example, element 1410) parallel to the second major surface. The structure includes a second dielectric layer (for example, element 127) formed overlying a part of the first electrode contact portion, and a second shield electrode contact portion (for example, element 142) formed in the contact trench and contacting the first electrode contact portion along the flat portion.

Those skilled in the art will also appreciate that according to a still further embodiment, a shield electrode contact structure comprises a contact trench (for example, element 27) formed in a region of semiconductor material (for example, element 11) having first and second opposing major surfaces (for example, elements 18,19). The structure includes a first conductive contact portion (for example, element 141) formed in a lower portion of the contact trench and having a recessed surface (for example, element 1410) that is parallel to the second major surface, wherein the first conductive contact portion is insulated (for example, element 259) from the region of semiconductor material, and wherein the first conductive contact portion is further coupled to at least one shield electrode structure in an active portion of the region of semiconductor material. The structure includes a second conductive contact portion (for example, element 142) formed in the contact trench and contacting the first conductive contact portion along the recessed surface.

In view of all the above, it is evident that a novel method and structure disclosed. Included, among other features, is a shield electrode contact structure formed in more than one portions, where a first portion is formed recessed within a contact trench and formed with a flat portion. A second portion is formed overlying the first portion and makes contact to the first portion along the flat portion. The method improves yields and devices performance by reducing manufacturing problems associated with related contact structures that use continuous conductive layers that curve upwards towards the major surface of the device.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FETs (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

I claim:

1. A method for forming an electrode contact structure comprising the steps of:
   providing a region of semiconductor material having a major surface;
   forming a contact trench extending from the major surface into the region of semiconductor material;
   forming a first dielectric layer along surfaces of the contact trench;
   forming a first electrode contact portion adjacent the first dielectric layer, wherein the first electrode contact portion is recessed below the major surface;
   forming a second dielectric layer overlying the first electrode contact portion;
   forming spacers along upper sidewall surfaces of the contact trench;
   forming an opening in the second dielectric layer aligned to the spacers; and
   forming a second electrode contact portion within the contact trench adjacent the spacers and contacting the first electrode contact portion within the contact trench.

2. The method of claim 1, wherein the step of forming the first dielectric layer comprises the steps of:
   forming a first oxide layer along surfaces of the contact trench;
   forming a second oxide layer along surfaces of the first oxide layer, where the second oxide layer comprises a deposited oxide; and
   removing upper portions of the first and second oxide layers after the step of forming the first electrode contact portion.

3. The method of claim 1, wherein the step of forming the first electrode contact portion comprises the steps of:
   forming a first conductive layer within the contact trench; and
   removing portions of the first conductive layer while leaving another portion of the first conductive layer within a lower portion of the contact trench, wherein the removing step forms the first electrode contact portion with a horizontal portion, and wherein the step of forming the second electrode contact portion includes forming the second contact portion so that the second contact portion makes contact to the first electrode contact portion along the horizontal portion.

4. The method of claim 3, wherein the step of removing portions of the first conductive layer comprises the steps of:
   planarizing the first conductive layer; and
   etching the first conductive layer to recess the first conductive layer within the contact trench.

5. The method of claim 1 further comprising the steps of:
   forming a third dielectric layer along upper surfaces of the contact trench and overlying the first electrode contact portion; and
   forming oxidation-resistant spacers along the third dielectric layer, wherein the step of forming the second dielectric layer comprises forming the second dielectric layer using localized oxidation.

6. The method of claim 5, wherein the step of forming the oxidation-resistant spacers comprises forming nitride spacers.

7. The method of claim 1 further comprising the step of recessing the second electrode contact portion within the contact trench below the major surface.

8. The method of claim 1 further comprising the steps of:
   forming an inter-layer dielectric overlying the major surface;
   forming an opening in the interlayer dielectric aligned to the second electrode contact portion; and
   forming a conductive plug in the opening and contacting the second electrode contact portion.

9. The method of claim 8 further comprising the step of forming a conductive region in an upper portion of the second electrode contact portion.

10. The method of claim 9, wherein the step of forming the conductive region comprises forming a self-aligned silicide region.

11. The method of claim 1, wherein the step of forming the first electrode contact portion comprises forming the first electrode contact portion configured as a first shield electrode contact portion.

12. A method for forming a semiconductor device comprising the steps of:
   providing a region of semiconductor material having first and second opposing major surfaces;
   forming a contact trench extending from the first major surface into the region of semiconductor material;
   forming a first dielectric layer along surfaces of the contact trench;
   forming a first shield electrode contact portion adjacent the first dielectric layer, wherein the first electrode contact portion is recessed below the first major surface and includes a flat portion parallel to the second major surface;
   forming a second dielectric layer overlying the first electrode contact portion;
   forming an opening in the second dielectric layer; and
   forming a second shield electrode contact portion within the contact trench contacting the first electrode contact portion within the contact trench and along the flat portion.

13. The method of claim 12 further comprising the step of forming spacers along upper sidewall surfaces of the contact trench before the step of forming the opening in the second dielectric layer, wherein the step of forming the opening includes forming the opening self-aligned to the spacers, and wherein the step of forming the second electrode contact portion includes forming the second electrode contact portion adjacent the spacers.

14. The method of claim 12, wherein the step of forming the first dielectric layer comprises the steps of:
   forming an oxide layer along surfaces of the contact trench; and
   removing upper portions of the oxide layer after the step of forming the first electrode contact portion.

15. The method of claim 12 further comprising the steps of:
forming a third dielectric layer along upper surfaces of the contact trench and overlying the first electrode contact portion; and
forming oxidation-resistant spacers along the third dielectric layer, wherein the step of forming the second dielectric layer comprises forming the second dielectric layer using localized oxidation.

16. The method of claim 12 further comprising the steps of:
recessing the second electrode contact portion within the contact trench below the first major surface;
forming a conductive region in an upper portion of the second electrode contact portion;
forming an inter-layer dielectric overlying the major surface;
forming an opening in the interlayer dielectric aligned to the second electrode contact portion; and
forming a conductive plug in the opening and contacting the second electrode contact portion.

17. A method of forming a semiconductor device having a shield electrode comprising:
providing a region of semiconductor material having first and second opposing major surfaces;
forming a contact trench extending from the first major surface into the region of semiconductor material;
forming a first dielectric layer along surfaces of the contact trench;
forming a first shield electrode contact portion adjacent the first dielectric layer, wherein the first electrode contact portion is recessed below the first major surface and includes a portion generally parallel to the second major surface;
forming oxidation-resistant spacers along upper sidewall surfaces of the contact trench;
forming a second dielectric layer overlying the first electrode contact portion using localized oxidation;
forming an opening in the second dielectric layer; and
forming a second shield electrode contact portion in the contact trench contacting the first electrode contact portion within the contact trench and along the portion generally parallel to the second major surface.

18. The method of claim 17 further comprising forming dielectric spacers along the upper sidewall surfaces of the contact trench before the step of forming the opening in the second dielectric layer, wherein forming the opening includes forming the opening self-aligned to the spacers, and wherein forming the second electrode contact portion includes forming the second electrode contact portion adjacent the dielectric spacers.

19. The method of claim 17 further comprising:
forming a third dielectric layer along the upper sidewall surfaces of the contact trench before the step of forming the oxidation-resistant spacers; and
removing the oxidation-resistant spacers before forming the dielectric spacers.

20. The method of claim 17, wherein the step of forming the first dielectric layer comprises the steps of:
forming a first oxide layer along surfaces of the contact trench;
forming a second oxide layer along surfaces of the first oxide layer, where the second oxide layer comprises a deposited oxide; and
removing upper portions of the first and second oxide layers after the step of forming the first shield electrode contact portion.

* * * * *